United States Patent [19]
Hahn et al.

[11] Patent Number: 5,499,312
[45] Date of Patent: Mar. 12, 1996

[54] PASSIVE ALIGNMENT AND PACKAGING OF OPTOELECTRONIC COMPONENTS TO OPTICAL WAVEGUIDES USING FLIP-CHIP BONDING TECHNOLOGY

[75] Inventors: Kenneth H. Hahn, Cupertino; Ronald T. Kaneshiro, Mountain View, both of Calif.

[73] Assignee: Hewlett-Packard Company, Palo Alto, Calif.

[21] Appl. No.: 299,176

[22] Filed: Aug. 31, 1994

Related U.S. Application Data

[63] Continuation-in-part of Ser. No. 150,648, Nov. 9, 1993, abandoned.

[51] Int. Cl.⁶ .................................................. G02B 6/42
[52] U.S. Cl. ................................ 385/91; 385/88; 385/89
[58] Field of Search ........................... 385/49, 50, 88–94

[56] References Cited

U.S. PATENT DOCUMENTS

| | | | |
|---|---|---|---|
| 4,727,649 | 3/1988 | Nishizawa | 385/92 X |
| 4,883,743 | 11/1989 | Booth et al. | 430/321 |
| 5,005,320 | 4/1991 | Furmanak | 451/285 |
| 5,015,059 | 5/1991 | Booth et al. | 385/49 |
| 5,016,958 | 5/1991 | Booth | 385/16 |
| 5,026,135 | 6/1991 | Booth | 385/130 |
| 5,062,681 | 11/1991 | Furmanak et al. | 385/50 |
| 5,098,804 | 3/1992 | Booth | 430/1 |
| 5,150,440 | 9/1992 | Booth | 385/49 |
| 5,168,541 | 12/1992 | Booth | 385/129 |
| 5,247,597 | 9/1993 | Blacha et al. | 385/88 |

FOREIGN PATENT DOCUMENTS

| | | | |
|---|---|---|---|
| 6-88917 | 3/1994 | Japan | 385/49 |
| 6-88918 | 3/1994 | Japan | 385/49 |

OTHER PUBLICATIONS

Craig A. Armiento et al., "Gigabit Transmitter Array Modules on Silicon Waferboard", IEEE Transactions on Components, Hybrids, and Manufacturing Technology, vol. 15, No. 6, Dec. 1992, pp. 1072–1080.

Craig A. Armiento et al., "Passive Coupling of InGaAsP/InP Laser Array and Singlemode Fibres Using Silicon Waferboard", Electronics Letter, vol. 27, No. 12, Jun. 6, 1991, pp. 1109–1110.

Mark A. Rothman et al., "Multichamber Rie Processing for InGaAsP Ridge Waveguide Laser Arrays", Mat. Res. Soc. Symp. Proc., vol. 240, 1992, pp. 341–348. (No Month).

(List continued on next page.)

Primary Examiner—John D. Lee

[57] ABSTRACT

A method and apparatus for automatic passive alignment of optical waveguides with photonic devices to provide for high volume production of optical components at low cost. The invention includes an optical waveguide having an extremity for transmission of light there through. A first wetable pad is mechanically coupled with the waveguide and is arranged at a selected lateral distance from the extremity of the waveguide. The invention further includes a photonic device having a central region on a surface of the photonic device. A second wetable pad is mechanically coupled with the photonic device and is arranged at a selected lateral distance from the central region of the photonic device. A suitable material, for example solder, is chosen and used in a bond for holding the first pad in alignment with the second pad, so as to substantially provide a desired optical alignment of the extremity of the waveguide with the central region of the photonic device. The chosen material is in a liquid form as it is disposed in contact with the first and second wetable pads. Surface tension of a controlled volume of the chosen material pulls the first wetable pad into alignment with the second wetable pad, thereby substantially aligning the extremity of the waveguide with the central region of the photonic device.

18 Claims, 8 Drawing Sheets

OTHER PUBLICATIONS

Craig A. Armiento, et al., "Four–Channel, Long–Wavelength Transmitter Arrays Incorporating Passive Laser/Singlemode–Fiber Alignment on Silicon Waferboard", IEEE, 1992, pp. 108–114. (No Month).

Craig A. Armiento et al., "Hybrid Optoelectonic Integration of Transmitter Arrays on Silicon Waferboard", SPIE, vol. 1582, Sep. 3–4, 1991, pp. 112–120.

Paul O. Haugsjaa et al., "Hybrid Wafer Scale Packaging of Laser Diodes and Multi–Chip Module Technology", SPIE vol. 1634, Jan. 20–22 1992, pp. 440–452.

Wale et al, "Flip–Chip Bonding Optimizes Opto–ICs", *IEEE Circuits and Devices,* Nov. 1992, pp. 25–31.

5,499,312

PASSIVE ALIGNMENT AND PACKAGING OF OPTOELECTRONIC COMPONENTS TO OPTICAL WAVEGUIDES USING FLIP-CHIP BONDING TECHNOLOGY

CROSS REFERENCE TO RELATED APPLICATION

This is a continuation in part of U.S. patent application Ser. No. 08/150,648 filed Nov. 9, 1993 entitled "Optical Detectors and Sources with Merged Holographic Optical Elements Suitable for Optoelectronic Interconnects"(now abandoned).

FIELD OF THE INVENTION

The present invention generally relates to optical waveguides and more particularly to optically coupling waveguides with photonic devices.

BACKGROUND OF THE INVENTION

Performance increases in advanced computer and data communication systems are limited by constraints of electrical interconnections of system components. Such limitations become more serious as demanded data rates increase from a range of millions of bits per second to a range of billions of bits per second.

Optical interconnection technology provides a high data bandwidth to satisfy the demand for such increased data rates. Despite the high data bandwidth of optical interconnection technology, one of the main obstacles to its commercial acceptance is the high cost of packaging optical components. For example, active manual alignment of an optical fiber with a laser in an optical package is time consuming and labor intensive, which adds to the cost of the optical package. Furthermore the time and labor needed limit high volume production of optical components.

What is needed is a method and apparatus for automatic passive alignment of optical waveguides with photonic devices that provides for high volume production of optical components at low cost.

SUMMARY OF THE INVENTION

The present invention provides a method and apparatus for automatic passive alignment of optical waveguides with photonic devices. In contrast to some teachings in the prior art, the present invention does not require time consuming and labor intensive manual active alignment of an optical fiber with a laser or other photonic device. Accordingly, the present invention provides high volume production of optical components at low cost.

Briefly, and in general terms, the invention includes an optical waveguide having an extremity for transmission of light there through. A first wetable pad is mechanically coupled with the waveguide and is arranged at a selected lateral distance from the extremity of the waveguide. The invention further includes a photonic device having a central region on a surface of the photonic device. A second wetable pad is mechanically coupled with the photonic device and is arranged at a selected lateral distance from the central region of the photonic device. The lateral distance from the central region of the photonic device to the second pad is substantially the same as the lateral distance from the extremity of the waveguide to the first pad.

A suitable material, for example solder, is chosen and used in a bond for holding the first pad in alignment with the second pad, so as to substantially provide a desired optical alignment of the extremity of the waveguide with the central region of the photonic device. The chosen material is in a liquid form as it is disposed in contact with the first and second wetable pads. Surface tension of a controlled volume of the chosen material pulls the first wetable pad into alignment with the second wetable pad, thereby substantially aligning the extremity of the waveguide with the central region of the photonic device. For example, solder is heated to a liquid phase as it is disposed in contact with the first and second wetable pads, so that surface tension of a controlled volume of the solder pulls the pads into alignment. The chosen material then solidifies to hold the pads in alignment. For example, the solder is cooled to a solid phase to hold the pads in alignment.

In some embodiments of the invention the photonic device and the second wetable pad are each mechanically coupled with a substrate so as to provide the mechanical coupling of the photonic device with the second wetable pad. Additionally, in some embodiments, a plurality of the waveguides are mechanically coupled with one another and a plurality of the photonic devices are mechanically coupled with one another. The first pad is held in with alignment the second pad so as to substantially provide a desired optical alignment of each waveguide with a respective one of the photonic devices.

To provide for flexible interconnection of optical components, it is preferred that the waveguides include flexible waveguides. Additionally to provide advantageous cost savings it is preferred that the waveguides include an optically transparent polymer.

Other aspects and advantages of the invention will become apparent from the following detailed description, taken in conjunction with the accompanying drawings, illustrating by way of example the principles of the invention.

DETAILED DESCRIPTION OF PREFERRED EMBODIMENT

Figure 1:
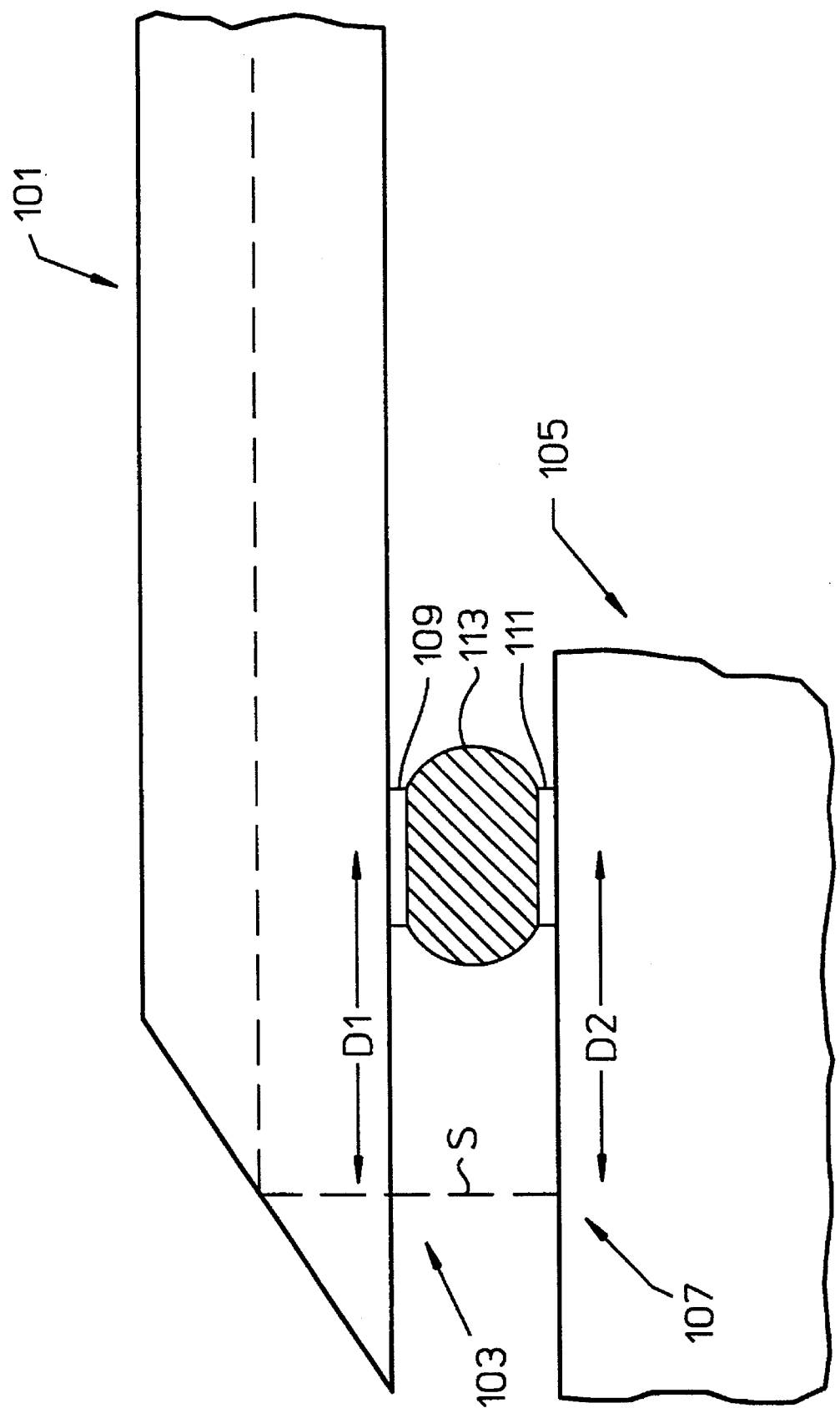
FIG. 1 is a detailed side view of a preferred embodiment of the invention.

FIG. 1 is a detailed side view of a preferred embodiment of the invention. As shown, an optical waveguide assembly 101 has an extremity 103 for transmission of light there through. To provide for flexible interconnection of optical components, it is preferred that the waveguide assembly include a flexible waveguide. Additionally, to provide advantageous cost savings it is preferred that the waveguide assembly include an optically transparent polymer for conducting light along a longitudinal dimension of the waveguide, which extends between the extremity of the waveguide and another extremity of the waveguide (not shown in FIG. 1).

FIG. 1 further shows a photonic device 105 in optical communication with the extremity of the waveguide. In general, photonic devices are those in which the basic particle of light, the photon, plays a major role. Accordingly, photonic devices employed in the invention include devices that detect optical signals through electronic processes, such as photodetectors, as well as devices that convert electrical energy into optical radiation, such as light emitting diodes and semiconductor lasers. For illustrative purposes, the photonic device shown in the example in FIG. 1 is a preferred semiconductor Surface Emitting Laser (SEL). In the embodiment shown in FIG. 1, a beam of light S representatively illustrated by a dashed line is emitted from the SEL photonic device, is transmitted through the extremity of waveguide, and is introduced to propagation by internal reflection within the waveguide. It should be understood that although a SEL is shown in FIG. 1, other photonic devices are substituted in place of the SEL shown in FIG. 1 with beneficial results. For example the SEL is advantageously replaced with a photodetector having a central region optically aligned with the extremity of the waveguide for receiving light therefrom.

As shown, the photonic device has a central region 107 on a surface of the photonic device. For a photonic device that detects optical signals through electronic processes, such as the photodetector, there is a desired high photodetection sensitivity to light received at the central region on the surface of the photonic device. Similarly, for a photonic device that that converts electrical energy into optical radiation, such as the light emitting diode or the semiconductor laser, there is a desired high emission from the central region on the surface of the photonic device.

FIG. 1 further shows a pair of wetable pads. A first wetable pad 109 is mechanically coupled with the waveguide and is arranged at a selected lateral distance, D1, from the extremity of the waveguide. A second wetable pad 111 is mechanically coupled with the photonic device and is arranged at a selected lateral distance, D2 from the central region of the photonic device. As shown the lateral distance from the central region of the photonic device to the second pad is selected to be substantially the same as the lateral distance from the extremity of the waveguide to the first pad.

A suitable material, for example solder, is chosen and used in a bond 113 for holding the first pad in alignment with the second pad, so as to substantially provide a desired optical alignment of the extremity of the waveguide with the central region of the photonic device. Preferably, the solder is used to provide a flip-chip solder bond, as discussed in further detail later herein.

Figure 2B:
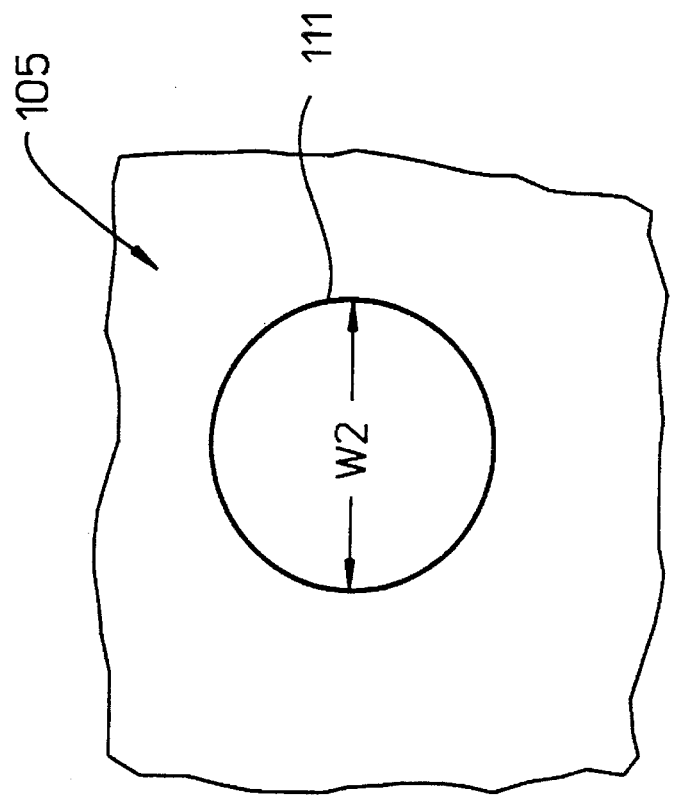
FIG. 2B is a detailed cut away top view of a photonic device shown in FIG. 1
Figure 2A:
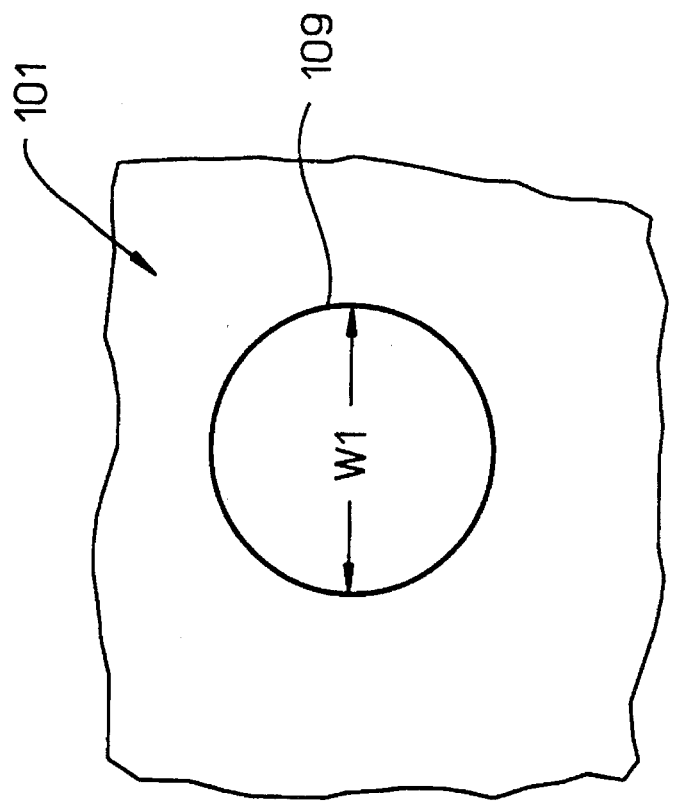
FIG. 2A is a detailed cut away bottom view of a waveguide shown in FIG. 1.

FIG. 2A is a detailed bottom view of the waveguide assembly 101 shown in FIG. 1 FIG. 2A is cut away to show the first pad 109, which has a suitable shape and width dimension, W1. For example, as shown in FIG. 2A, the first pad has an circular shape and a width dimension, W1, of approximately 100 microns.

In the preferred embodiment, the first pad is photolithographically deposited at a location on the surface of the waveguide. Preferably, the location on the surface of the waveguide is ion milled prior to deposition of the first pad, so as to promote adhesion of the first pad to the location on the surface of the waveguide.

In the preferred embodiment, photolithographic mask alignment techniques are advantageously employed in depositing the first pad at the selected distance from the extremity of the waveguide. Preferred placement accuracy is within ten to twenty microns, so as to provide good optical alignment and optical coupling efficiency of the extremity of the waveguide with the central region of the photonic device. Preferably the first pad is deposited on the surface of the waveguide by sputtering metals through a suitably aligned mask. For example, a layer of Tungsten approximately 1500 Angstroms thick is deposited first, followed by a layer of Nickel-Vanadium alloy approximately 2000 Angstroms thick, followed by a layer of Gold approximately 500 Angstroms thick.

FIG. 2B is a detailed cut away top view of the photonic device 105 shown in FIG. 1. Preferably the second pad 111 is photolithographically deposited on the photonic device in a similar manner as described previously herein with respect to the first pad. Photolithographic mask alignment techniques are advantageously employed so that the second pad is deposited at the selected distance from the central region of the photonic device. Preferably, the second pad has a shape and dimensions W2 that match the first pad.

Figure 3A:
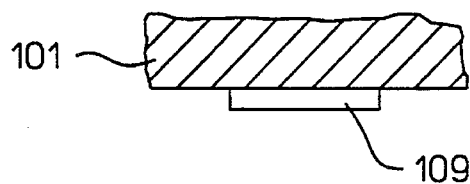
FIGS. 3A–3G are detailed cross sectional views illustrating making a flip-chip solder bond shown in FIG. 1.
Figure 3B:
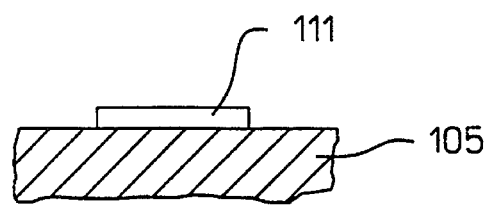
Figure 3C:
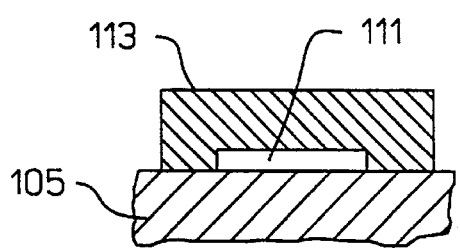
Figure 3D:
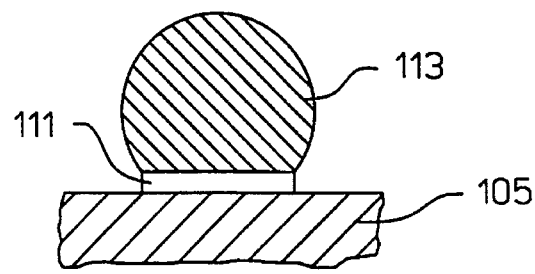

FIGS. 3A–3G are detailed cross sectional views illustrating making the flip-chip solder bond shown in FIG. 1. FIG. 3A shows a detailed cross sectional view of the waveguide assembly 101 and of the first wetable pad 109 of FIG. 2A. FIG. 3B shows a detailed cross sectional view of the photonic device 105 and of the second wetable pad 111 of FIG. 2B. A molybdenum mask a few mills thick is preferably used for shadow evaporating a controlled volume of solder over the second wetable pad. The mask is removed, leaving a solder layer 113 as shown in FIG. 3C. Preferably the solder layer is approximately 3 mills thick. As shown in FIG. 3D, the solder is heated above its melting point to re-flow into a molten solder bump, which is then allowed to cool.

Figure 3E:
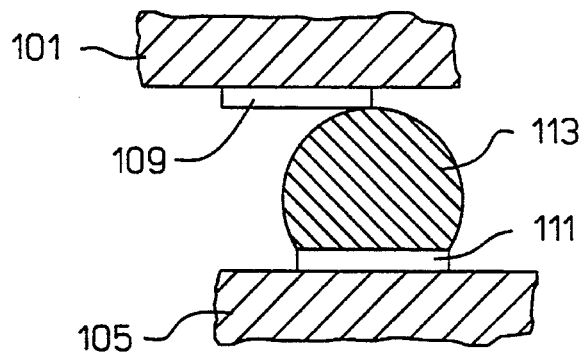
Figure 3F:
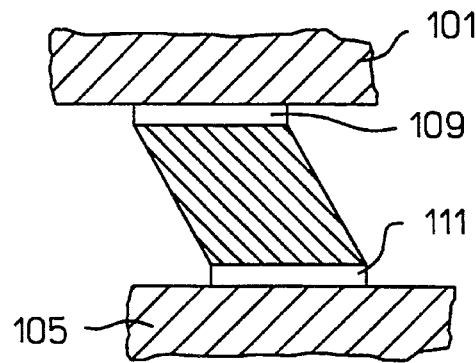
Figure 3G:
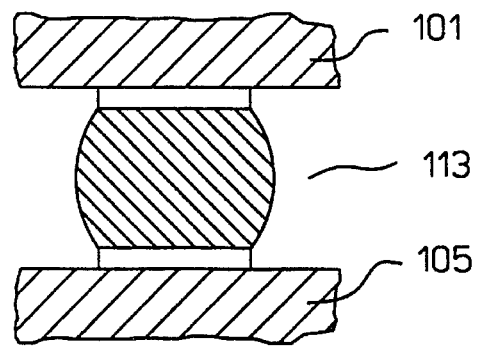

The controlled volume of the solder in liquid form is disposed in contact with the first and second wetable pads, so that surface tension of the controlled volume of the solder pulls the first pad in to alignment with the second pad, thereby pulling the extremity of the waveguide into substantial optical alignment with the central region of the photonic device. For example, as shown in FIG. 3E, the solder is heated to a liquid phase and the first and second wetable pads are proximately disposed. As shown in FIG. 3F, surface tension of the solder acts to pull the first pad towards alignment with the second pad. As shown in FIG. 3G, once the pads are aligned the solder bond is solidified. More particularly, the solder is cooled to a solid phase in the bond 113, so as to hold the first pad in alignment with the second pad and thereby hold the extremity of the waveguide in substantial optical alignment with the central region of the photonic device.

Given the controlled solder volume and the first and second wetable pads each having the respective width dimensions of approximately one hundred microns, the solder bond has a preferred height within a range of approximately seventy to eighty microns. It should be understood that by controlling the width dimensions of the wetable pads and the solder volume, a vertical separation between the extremity of the waveguide aligned with the central region of the photonic device is controlled. Coupling of light between the extremity of the waveguide and the central portion of the photonic device is improved as the vertical separation there between is reduced. While it is possible to further reduce solder volume so that the extremity of the waveguide almost touches the central region of the photonic device, this is not preferred because the reduced solder volume also has reduced elasticity, which may result in undesirable breakage of the solder bond in response to a shear force created by differential thermal expansion of the waveguide and the photonic device.

While it is possible to further increase solder volume to further increase the elasticity, this is not preferred because the increased volume of the solder increases the vertical separation between the waveguide and the photonic device, resulting in undesirable reduced coupling of light between the waveguide and the photonic device. Accordingly there is a trade off between increased elasticity of the solder bond and increased coupling of light between the waveguide and the photonic device. The solder bond having the preferred height within the range of approximately seventy to eighty microns advantageously provides for both good elasticity of the solder bond and good coupling of light between the waveguide and the photonic device.

Figure 4:
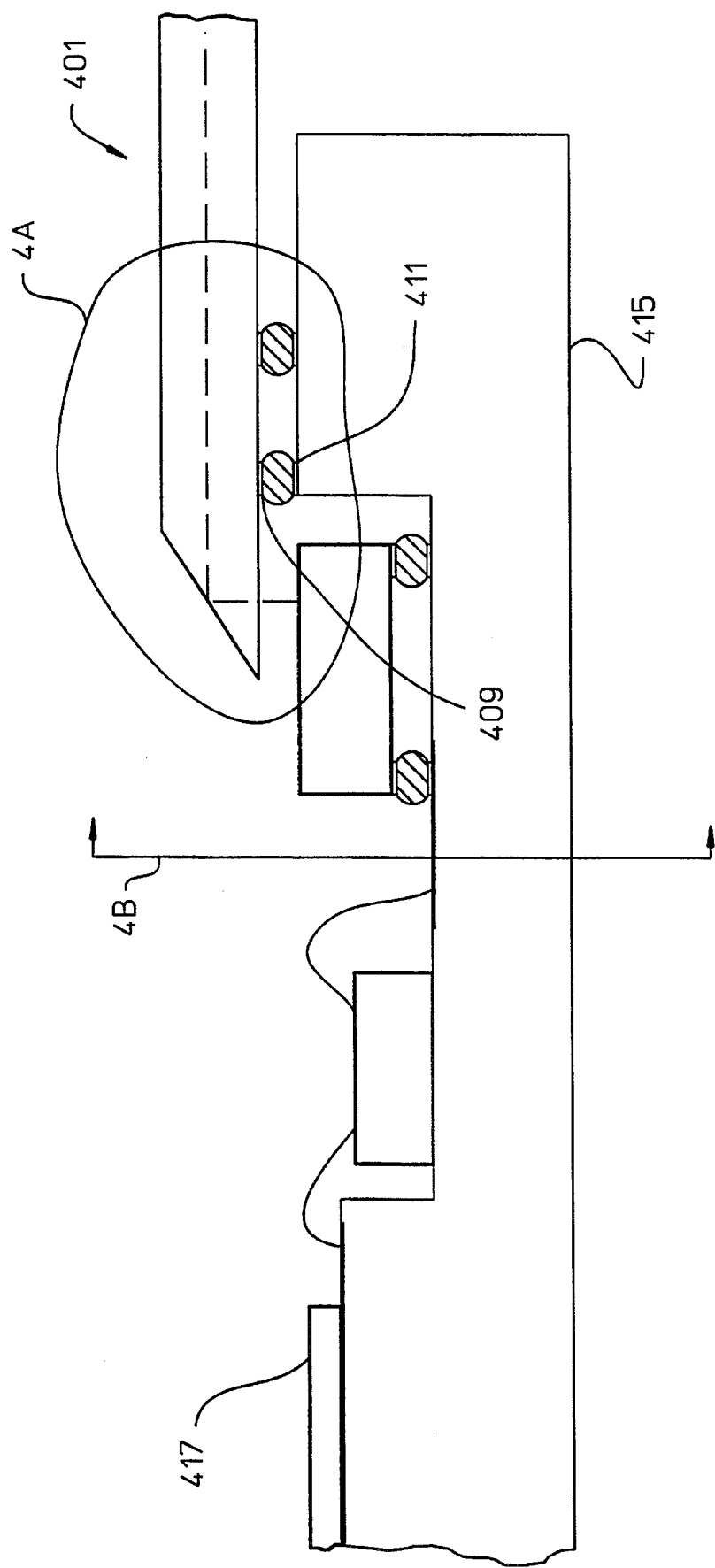
FIG. 4 is a side view of another preferred embodiment of the invention.

FIG. 4 is a side view of another preferred embodiment of the invention, which shows a waveguide assembly 401 and a photonic device 405 supported by a substrate 415. The substrate further supports a plurality of integrated circuits, for example, a transceiver integrated circuit 417 that is electrically coupled with the photonic device as shown in FIG. 4.

Figure 4A:
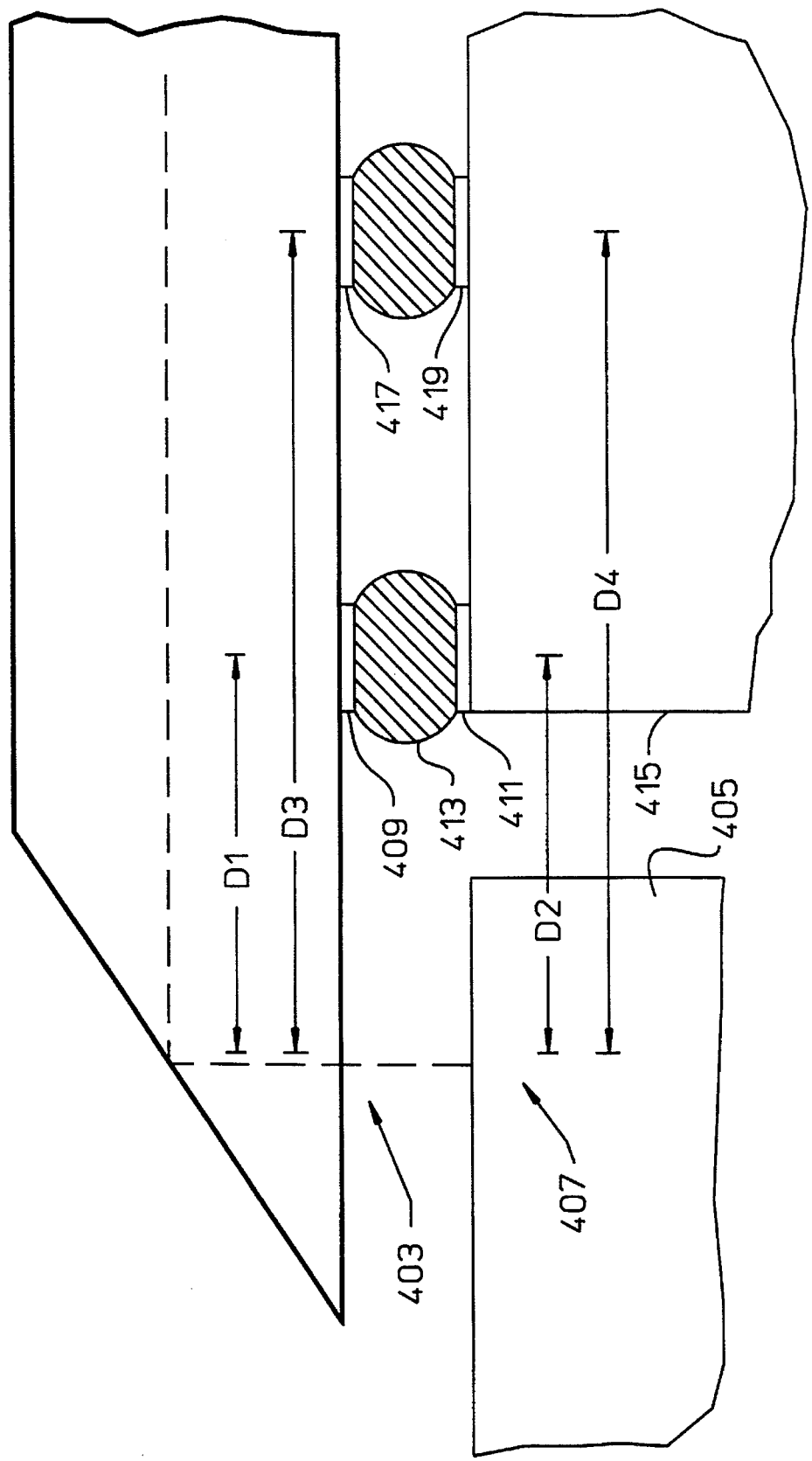
FIG. 4A shows further detail of FIG. 4.

Further details of FIG. 4 are shown in FIG. 4A. As shown, the photonic device has a central region 407 on the surface of the photonic device. The central region 407 of the photonic device is in optical communication with a waveguide extremity 403 for transmission of light there through.

FIGS. 4 and 4A show a pair of wetable pads, wherein a first wetable pad 409 is mechanically coupled with the waveguide. Since a second wetable pad 411 and the photonic device 405 are each mechanically coupled with the substrate 415, the substrate provides an indirect mechanical coupling of the photonic device with the second wetable pad. As shown in FIG. 4A the first wetable pad is arranged at a selected lateral distance D1 from the extremity of the waveguide. Similarly, the second wetable pad is arranged at a selected lateral distance D2 from the central region of the photonic device. The lateral distance from the central region of the photonic device to the second pad is selected to be substantially the same as the lateral distance from the extremity of the waveguide to the first pad. A suitable material, for example solder, is chosen and used in a bond 413 for holding the first pad in alignment with the second pad, so as to provide optical alignment of the extremity of the waveguide with the central region of the photonic device.

FIGS. 4 and 4A further show another pair of wetable pads. A third wetable pad 417 is mechanically coupled with the waveguide and arranged at a lateral distance D3 from the extremity of the waveguide. A fourth wetable pad 419 is mechanically coupled with the photonic device and arranged at a lateral distance D4 from the central region of the photonic device. The lateral distance from the extremity of the waveguide to the third pad is substantially the same as the lateral distance from the central region of the photonic device to the fourth pad. The chosen material holds the third pad in alignment with the fourth pad so as to further provide for the optical alignment of the waveguide with the photonic device.

Figure 4B:
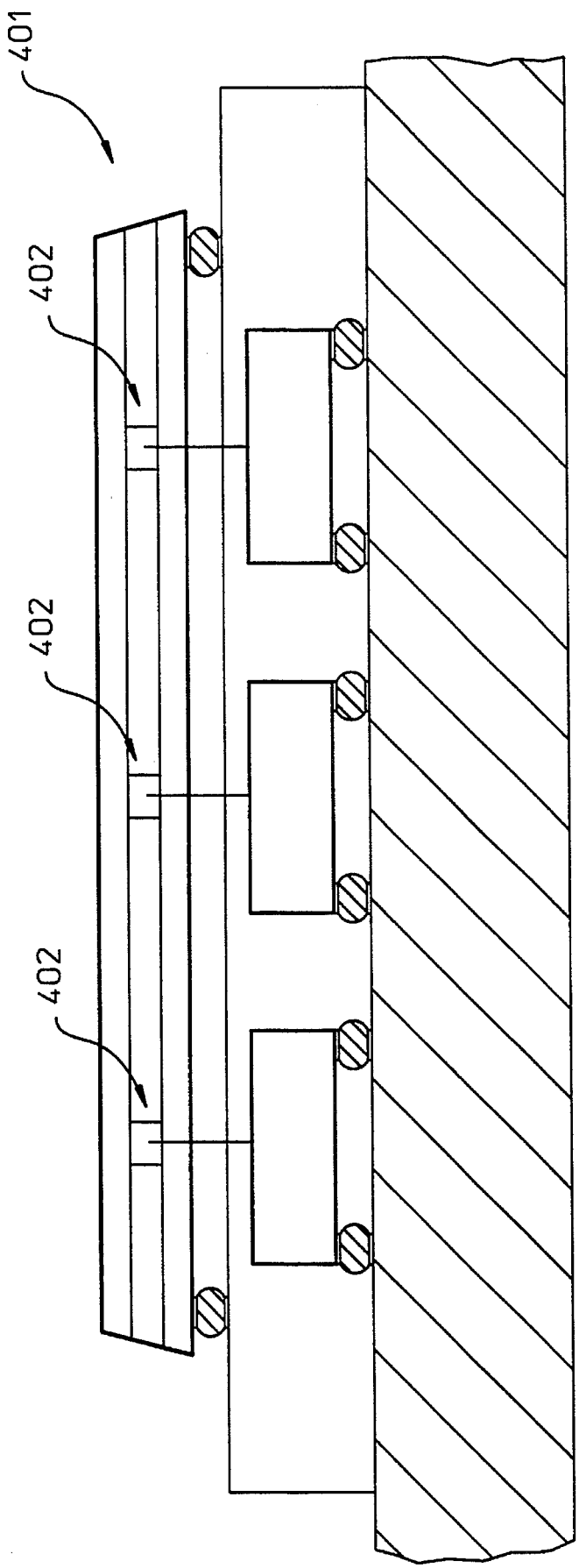
FIG. 4B is a cut away front view of the embodiment shown in FIG.4.

FIG. 4B is a cut away front view of the embodiment shown in FIG. 4. As shown, a plurality of optical waveguides 402 are mechanically coupled with one another in the waveguide assembly 401. Preferably, the plurality of waveguide 402 are defined photolithographically in a manner well known to those with ordinary skill in the art using a single mask on a single polymer layer as shown FIG. 4B. Preferably the polymer layer is then sandwiched between buffer layers as shown in FIG. 4B. Helpful background information is found in patents issued to Bruce L. Booth such as U.S. Pat. No. 5,026,135 entitled "Moisture Sealing of Optical Waveguide Devices with Doped Silicon Dioxide", which is incorporated herein by reference.

Preferably, a plurality of the photonic devices are mechanically coupled with one another. For example, in FIG. 4B the photonic devices are each mechanically coupled to the substrate, so as to indirectly provide the mechanical coupling of the photonic devices with one another. Just as photolithographic mask alignment techniques are advantageously employed in depositing the first pad at the selected distance from the extremity of the waveguide, photolithographic mask alignment techniques are similarly employed to provide accurate placement of pads used to mechanically couple the photonic devices to the substrate. For the sake of simplicity only three photonic devices and three waveguides are shown in FIG. 4B, although it should be understood that larger numbers of waveguides and photonic devices are employed with beneficial results.

As shown, the solder holding the first pad in alignment the second pad substantially provides a desired optical alignment of each waveguide with a respective one of the photonic devices. FIG. 4B further shows another pair of wetable pads soldered together for further providing the desired optical alignment.

Figure 5:
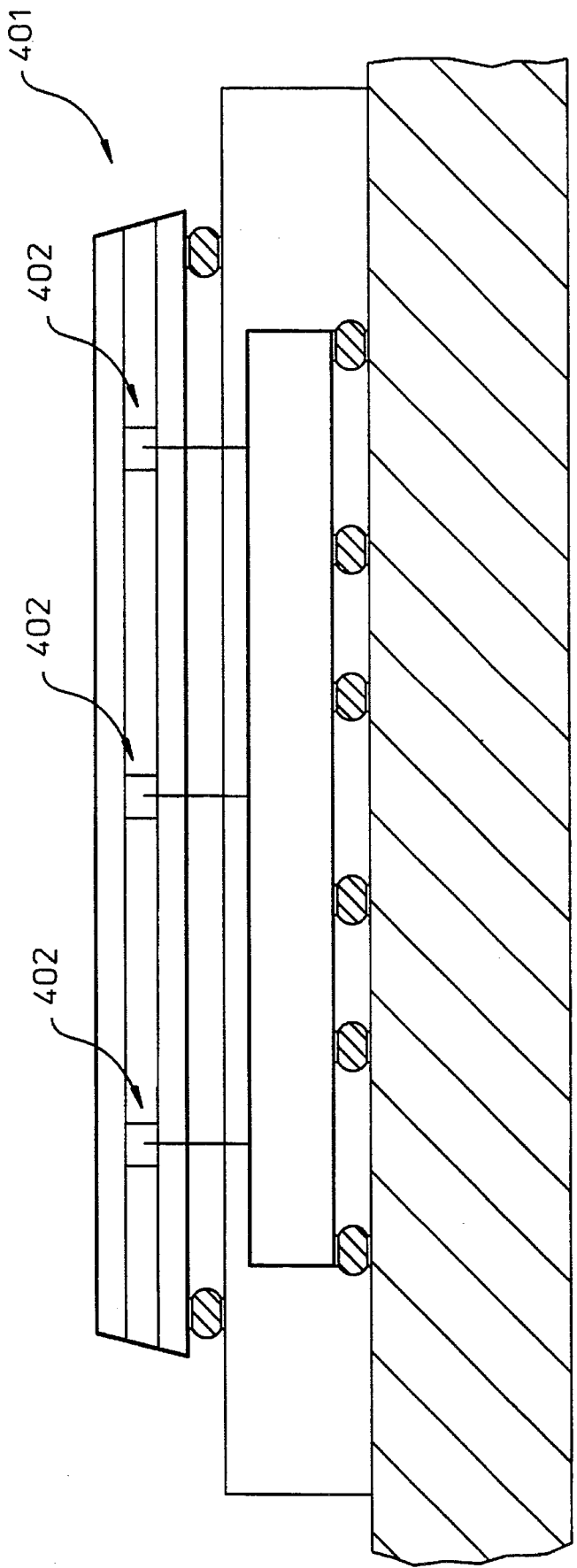
FIG. 5 is a cut away front view of yet another preferred embodiment of the invention.

FIG. 5 is a cut away front view of yet another preferred embodiment of the invention. The embodiment shown in FIG. 5 is generally similar to that which is shown in FIG. 4B and discussed in detail previously herein. However, it should be noted that in FIG. 5 the plurality of photonic devices are fabricated together in a photonic device assembly.

Figure 6:
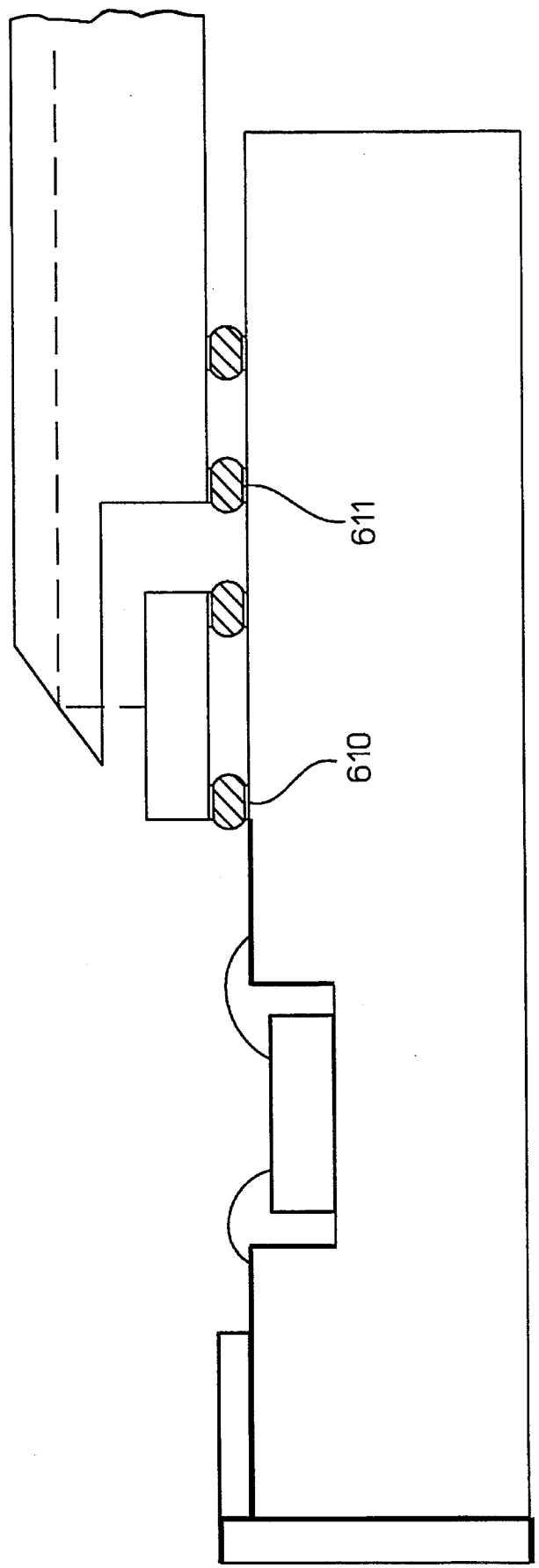
FIG. 6 is a side view of yet another preferred embodiment of the invention.

FIG. 6 is a side view of yet another preferred embodiment of the invention. The embodiment shown in FIG. 6 is generally similar to that which is shown in FIG. 4 and discussed in detail previously herein. However, it should be noted that in FIG. 6 pads 610 deposited on the substrate for coupling to the photonic device are in substantially coplanar alignment with pads 611 deposited on the substrate for coupling to the waveguide, advantageously providing simplified optical alignment of the photonic device and the waveguide.

As discussed herein, the method and apparatus of the invention automates passive alignment of optical waveguides with photonic devices to provide for high volume production of optical components at low cost. Although specific embodiments of the invention have been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

What is claimed is:

1. An apparatus comprising:

an optical waveguide having an extremity for transmission of light there through, and further having at least one outer surface region that is substantially planar;

a photonic device having a central region on a surface of the photonic device;

a pair of wetable pads including:

a first wetable pad mechanically coupled with the substantially planar surface region of the waveguide and arranged at a selected lateral distance from the extremity of the waveguide; and a second wetable pad mechanically coupled with the photonic device and arranged at a selected lateral distance from the central region of the photonic device;

and a bond for holding the first pad in alignment with the second pad, so as to substantially provide a desired optical alignment of the extremity of the waveguide with the central region of the photonic device.

2. An apparatus as in claim 1 wherein the lateral distance from the central region of the photonic device to the second pad is substantially the same as the lateral distance from the extremity of the waveguide to the first pad.

3. An apparatus as in claim 1 wherein the waveguide includes a flexible waveguide.

4. An apparatus as in claim 1 wherein the waveguide comprises an optically transparent polymer.

5. An apparatus as in claim 1 wherein the first pad mechanically coupled with the waveguide is photolithographically deposited on the substantially planar surface of the waveguide.

6. An apparatus as in claim 1 further comprising a substrate, wherein the photonic device and the second wetable pad are each mechanically coupled with the substrate so as to provide said mechanical coupling of the photonic device with the second wetable pad.

7. An apparatus as in claim 1 further comprising:

another pair of wetable pads including:

a third wetable pad mechanically coupled with the substantially planar region of the waveguide and arranged at a lateral distance from the extremity of the waveguide; and a fourth wetable pad mechanically coupled with the photonic device and arranged at a lateral distance from the central region of the photonic device;

and another bond for holding the third pad in alignment with the fourth pad so as to further provide for the optical alignment of the waveguide with the photonic device.

8. An apparatus as in claim 7 wherein the lateral distance from the extremity of the waveguide to the third pad is substantially the same as the lateral distance from the central region of the photonic device to the fourth pad.

9. An apparatus as in claim 1 further comprising:

a plurality of waveguides integrally coupled with one another; and a plurality of photonic devices mechanically coupled with one another, wherein the bond for holding the first pad in alignment with the second pad substantially provides a desired optical alignment of each waveguide with a respective one of the photonic devices.

10. An optical alignment method comprising the steps of:

providing an optical waveguide having an extremity for transmission of light there through, and further having at least one outer surface region that is substantially planar;

providing a photonic device having a central region on a surface of the photonic device;

arranging a first wetable pad in mechanical communication with the substantially planar region of the waveguide;

arranging a second wetable pad in mechanical communication with the photonic device; and disposing a controlled volume of a material in liquid form in contact with the first wetable pad and the second wetable pad, so that surface tension of the controlled volume of the material pulls the first pad in to alignment with the second pad, thereby pulling the extremity of the waveguide into substantial optical alignment with the central region of the photonic device.

11. A method as in claim 10 wherein the step of arranging the first pad in mechanical communication with the waveguide includes photolithographically depositing the first pad at a location on the substantially planar surface of the waveguide.

12. A method as in claim 10 wherein the step of arranging the first pad in mechanical communication with the waveguide includes ion milling a location on the surface of the waveguide so as to promote adhesion of the first pad to the location on the surface of the waveguide.

13. A method as in claim 10 wherein:

the step of arranging the first pad includes arranging the first pad at a selected lateral distance from the extremity of the waveguide; and the step of arranging the second pad includes arranging the second wetable pad at a selected lateral distance from the central region of the photonic device, so that the lateral distance form the central region of the photonic device to the second pad is substantially the same as the lateral distance from the extremity of the waveguide to the first pad.

14. A method as in claim 10 wherein the step of disposing the controlled volume of material in liquid form includes heating solder to a liquid phase.

15. A method as in claim 10 further comprising solidifying the material so as to hold the first pad in alignment with the second pad, thereby holding the extremity of the waveguide in substantial optical alignment with the central region of the photonic device.

16. A method as in claim 15 wherein the step of solidifying the material includes cooling solder to a solid phase.

17. An apparatus comprising:

an optical waveguide having an extremity for transmission of light there through;

a photonic device having a central region on a surface of the photonic device;

a pair of wetable pads including:

a first wetable pad mechanically coupled with the waveguide; and a second wetable pad photolithographically deposited on the surface of the photonic device;

and a bond for holding the first pad in alignment with the second pad, so as to substantially provide a desired optical alignment of the extremity of the waveguide with the central region of the photonic device.

18. An apparatus as in claim 17 wherein the first pad mechanically coupled with the waveguide is photolithographically deposited on a surface of the waveguide.

* * * * *